United States Patent [19]
Naito et al.

[11] Patent Number: 5,992,639
[45] Date of Patent: Nov. 30, 1999

[54] CARRIER TAPE WITH REINFORCED POCKETS AND METHOD FOR FABRICATING CARRIER TAPE

[75] Inventors: Fuminori Naito, Iiyama; Yukio Ando, Kawasaki; Osamu Kanai; Kazuo Kobayashi, both of Iiyama, all of Japan

[73] Assignees: Fujitsu Limited, Kanagawa; Fujitsu Takamizawa Component Limited, Tokyo, both of Japan

[21] Appl. No.: 08/927,064

[22] Filed: Sep. 10, 1997

[30] Foreign Application Priority Data

Apr. 2, 1997 [JP] Japan ................................ 9-083769

[51] Int. Cl.⁶ ............................................. B65D 85/90
[52] U.S. Cl. ............................................. 206/714
[58] Field of Search ........................... 206/330, 332, 206/714, 719, 725; 220/DIG. 30

[56] References Cited

U.S. PATENT DOCUMENTS

| | | | |
|---|---|---|---|
| 4,657,137 | 4/1987 | Johnson | 206/474 |
| 4,709,808 | 12/1987 | Balduff et al. | 220/DIG. 30 |
| 4,724,958 | 2/1988 | Kaneko et al. | 206/714 |
| 5,648,136 | 7/1997 | Bird | 206/174 |
| 5,769,236 | 6/1998 | Maruyama et al. | 206/714 |
| 5,769,237 | 6/1998 | Althouse et al. | 206/714 |

FOREIGN PATENT DOCUMENTS

| | | | |
|---|---|---|---|
| 4-239464 | 8/1992 | Japan | 206/330 |
| 4-24581 | 8/1992 | Japan | 206/330 |
| 5-32287 | 2/1993 | Japan | 206/332 |
| 5-170275 | 7/1993 | Japan | 206/332 |

*Primary Examiner*—Jim Foster
*Attorney, Agent, or Firm*—Staas & Halsey LLP

[57] ABSTRACT

A carrier tape having a row of pockets for accommodating electronic components therein is made by injection molding such that a thickness of connecting walls between the pockets is less than a thickness of a bottom wall of each pocket, to allow rolling of the row, and reinforcement of the bottom to protect the electronic components.

11 Claims, 7 Drawing Sheets

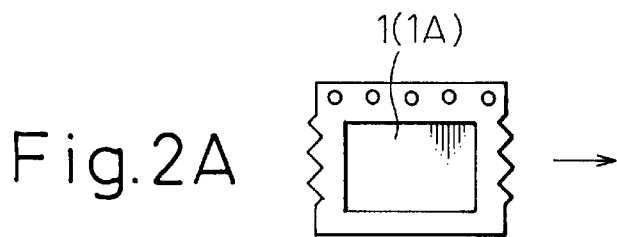
Fig.2A
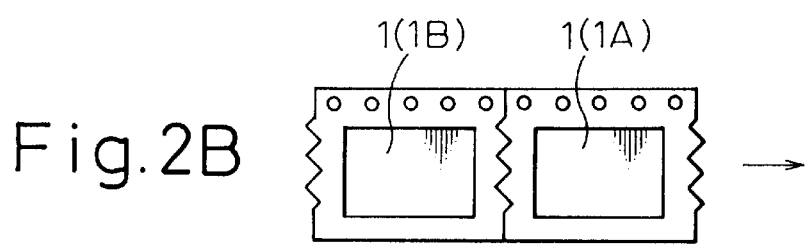
Fig.2B
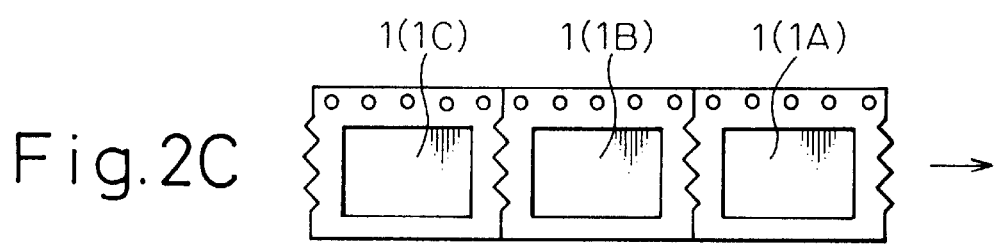
Fig.2C
Fig.3A  Fig.3B  Fig.3C  Fig.3D  Fig.3E
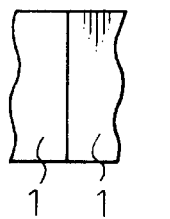 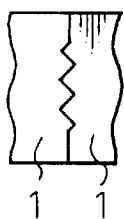 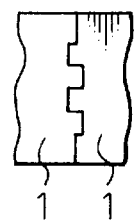 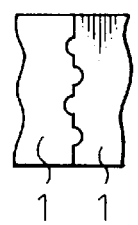 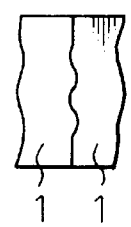

CARRIER TAPE WITH REINFORCED POCKETS AND METHOD FOR FABRICATING CARRIER TAPE

BACKGROUND OF THE INVENTION

1. Field of the Invention

The present invention relates to a carrier tape used for packing surface-mounting type electronic devices and a method for fabricating such a carrier tape. The present invention also relates to a taped package having electronic devices packed by such a carrier tape.

2. Description of the Related Art

Conventionally, electronic devices, and in particular surface-mounting type electronic devices, are sometimes packed using trays or embossed type carrier tapes, and the thus formed packages are shipped to users. The users use the electronic devices in such packages in automated mounting machines to mount the electronic devices to the surface of the printed wiring boards or the like.

FIG. 14 of the attached drawings is a perspective view of the tray. The tray has a plurality of square cavities (pockets) 41 arranged in a matrix pattern, so that the electronic devices can be accommodated in the pockets 41.

FIG. 15 of the attached drawings is a perspective view of the embossed type carrier tape. In this figure, the numeral 50 shows the embossed type carrier tape, the numeral 60 shows a top cover tape, and the numeral 70 shows a reel. The embossed type carrier tape 50 has a row of pockets 51 and connecting wall portions 52 interconnecting adjacent pockets 51. The embossed type carrier tape 50 is made from a plastic sheet (tape) which is embossed by vacuum forming or heat pressing, to form the pockets 51. The carrier tape 50 also has feed holes 53.

The package of electronic devices is used as follows; the electronic devices are put in the pockets 51 of the carrier tape 50, the pockets 51 are covered by the top cover sheet 60 bonded to the carrier tape 50, and the carrier tape 50 is wound on the reel 70. The manufacturer then ships the reel 70 as a package, and the user thus uses the reel 70 in an automated mounting machine to mount the electronic devices to the surface of a printed wiring board or the like. After the mounting operation, the carrier tape 50 is severed into small pieces by a cutter attached to the automated mounting machine, and the severed carrier tape 50 is disposed of.

In the mounting operation of the electronic devices to the surface of the printed wiring board by the automated mounting machine, it is generally recognized that the electronic devices packed in the carrier tape can be mounted to the printed wiring board at a considerably faster speed than that of the electronic devices packed in the tray. However, since the embossed type carrier tape 50 is made from a plastic sheet having a uniform thickness and the pockets 51 are embossed by vacuum forming or heat pressing, there are problems that if a relatively thick plastic sheet is used, it is not easy to wind the embossed type carrier tape 50 on the reel 70, and if the relatively thin plastic sheet is used, the strength of the pockets 51 is insufficient to reliably accommodate, in particular, large articles, so that the bottoms of the pockets may collapse while the embossed type carrier tape is wound on the reel, to cause the articles in the pockets to be damaged (for example, the external leads may be deformed in the case of a QFP (Quad Flat Package) type LSI). In addition, it is difficult to accurately form the pockets which are designed to accommodate larger articles. Therefore, conventionally, there is a problem that larger articles must be packed in the trays. FIG. 13 in the attached drawings is a side view of the package, illustrating the problem of the prior art. This figure shows that the embossed type carrier tape is wound on the reel and the bottoms of the pockets located on the outer side of the bent portion of the tape are collapsed.

SUMMARY OF THE INVENTION

The object of the present invention is to solve the above described problems and to provide a carrier tape and a method for fabricating such a carrier tape, which can be wound onto a reel without difficulty even if the carrier tape is intended to pack relatively large articles.

Another object of the present invention is to provide a carrier tape and a method for such a carrier tape, in which the bottoms of the pockets are strengthened to prevent the articles accommodated in the pockets from being damaged.

A further object of the present invention is to provide a taped package comprising a carrier tape and articles accommodated in the pockets of the carrier tape.

According to the present invention, there is provided a carrier tape having a row of pockets comprising bottom walls and side walls for accommodating articles therein, and connecting walls interconnecting the side walls of adjacent pockets, at least the bottom walls having a thickness greater than a thickness of the connecting walls to reinforce at least the bottom walls.

Preferably, the tape comprises a biodegradable plastic or an electrically conductive plastic. Preferably, the tape comprises a first region including at least the pocket and a second region, the first region comprising an electrically conductive plastic, the second region comprising an electrically non-conductive plastic.

Preferably, the pocket has a plurality of through holes at the bottom wall. Also, preferably, the tape has a region to which a top cover tape is to be bonded after an article is accommodated in the pocket, the surface of the region being roughened. Also, preferably, the pockets comprise a plurality of kinds of pockets differing in at least one of a shape and a dimension. Also, preferably, the tape has a hole pattern at or adjacent to a particular one of the pockets. Also, preferably, the tape has at least one of through holes, notches, and thin wall portions arranged at a longitudinally constant pitch so that a widthwise cross-sectional area of the tape is reduced.

According to another aspect of the present invention, there is provided a method for fabricating a carrier tape having a row of pockets. The method comprising the steps of forming carrier tape sections by injection molding so that each of the carrier tape sections has at least one pocket for accommodating an article therein, and joining the carrier tape sections in the form of a tape.

Preferably, the carrier tape sections have respective sides, and wherein the first carrier tape section is first injection molded, the second carrier tape section is then injection molded such that one side of the first carrier tape section is in contact with one side of the second carrier tape section, and the further one carrier tape section is then injection molded such that one side of the second carrier tape section is in contact with one side of the further one carrier tape section, whereby the carrier tape sections are successively joined together.

Preferably, a plurality of kinds of carrier tape sections differing in at least one of a shape and a dimension are formed by injection molding, and the carrier tape sections are joined in the form of a tape.

Preferably, the carrier tape sections are formed by two-color injection molding so that each of the carrier tape sections comprises a first region of an electrically conductive plastic and a second region of an electrically non-conductive plastic.

According to a further aspect of the present invention, there is provided a taped package comprising a carrier tape arranged in the above described manner, and articles accommodated in the pockets of the carrier tape.

In the present invention, the bottom walls of the carrier tape are made thicker to reinforce the bottom walls so that the bottoms of the pockets are strengthened to prevent the articles accommodated in the pockets from being damaged, and on the other hand, the connecting walls are maintained thinner, so that the carrier tape can be easily wound on a reel without difficulty. In the conventional embossed type carrier tape, it is difficult to partially increase the thickness of the carrier tape which is fabricated by vacuum forming or heat pressing, but according to the present invention, it is possible to partially increase the thickness of the carrier tape, by fabricating the carrier tape by injection molding. In addition, in the taped package comprising such a carrier tape arranged and articles accommodated in the pockets of the carrier tape, the pockets are not easily collapsed and the articles in the pockets are not damaged, even when the articles to be accommodated in the pockets are relatively large.

BRIEF DESCRIPTION OF THE DRAWINGS

The present invention will become more apparent from the following description of the preferred embodiments, with reference to the accompanying drawings, in which:

FIGS. 2A to 2C are views illustrating a method for fabricating a carrier tape according to an embodiment of the present invention;

FIGS. 3A to 3E are views illustrating examples for joining carrier tape sections;

DESCRIPTION OF THE PREFERRED EMBODIMENTS

Figure 1A:
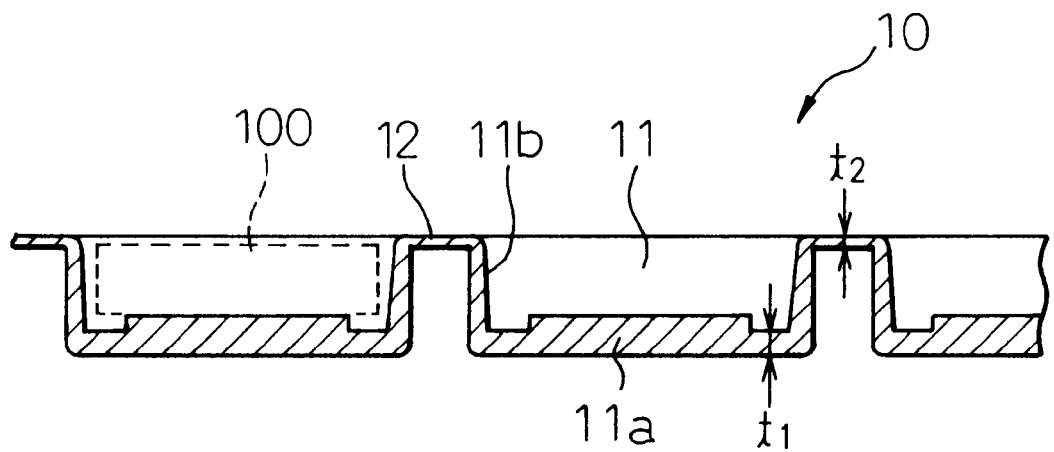
FIG. 1A is a cross-sectional view of a carrier tape according to an embodiment of the present invention.
Figure 1B:
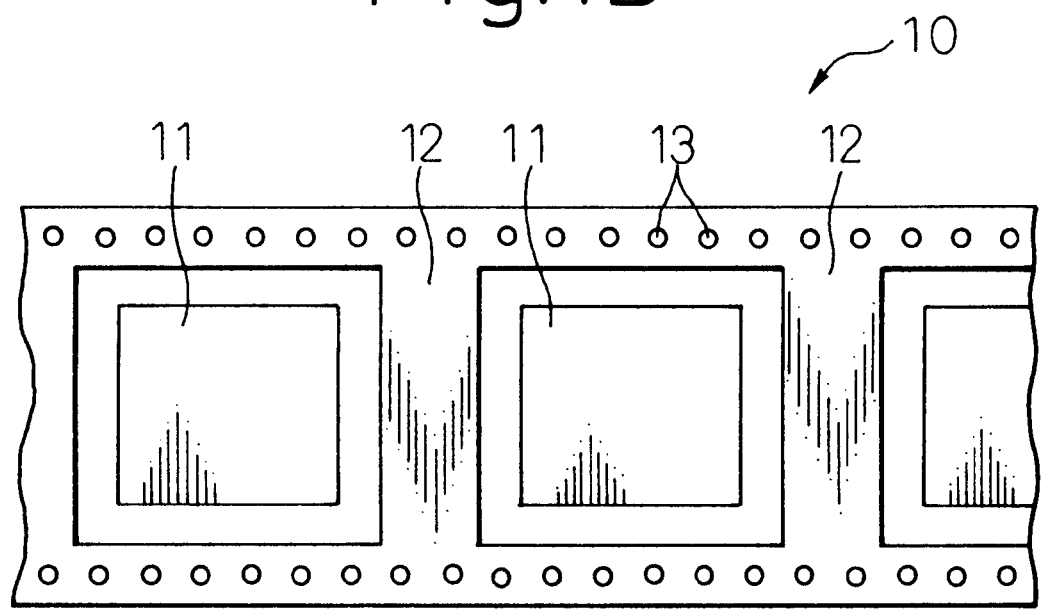
FIG. 1B is a plan view of the carrier tape of FIG. 1A.

FIGS. 1A and 1B show a carrier tape 10 according to the embodiment of the present invention. FIG. 1A is a cross-sectional view of the carrier tape 10 and FIG. 1B is a plan view of the carrier tape 10. The carrier tape 10 comprises a row of pockets 11 for accommodating articles such as surface-mounting type electronic devices (LSIs, for example) therein, and connecting walls 12 interconnecting the pockets 11. Each of the pockets 11 is formed by a bottom wall 11a and side walls 11b, and the connecting walls 12 are contiguous with the tops of the side walls 11b. The carrier tape 10 also has feed holes 13.

Figure 15:
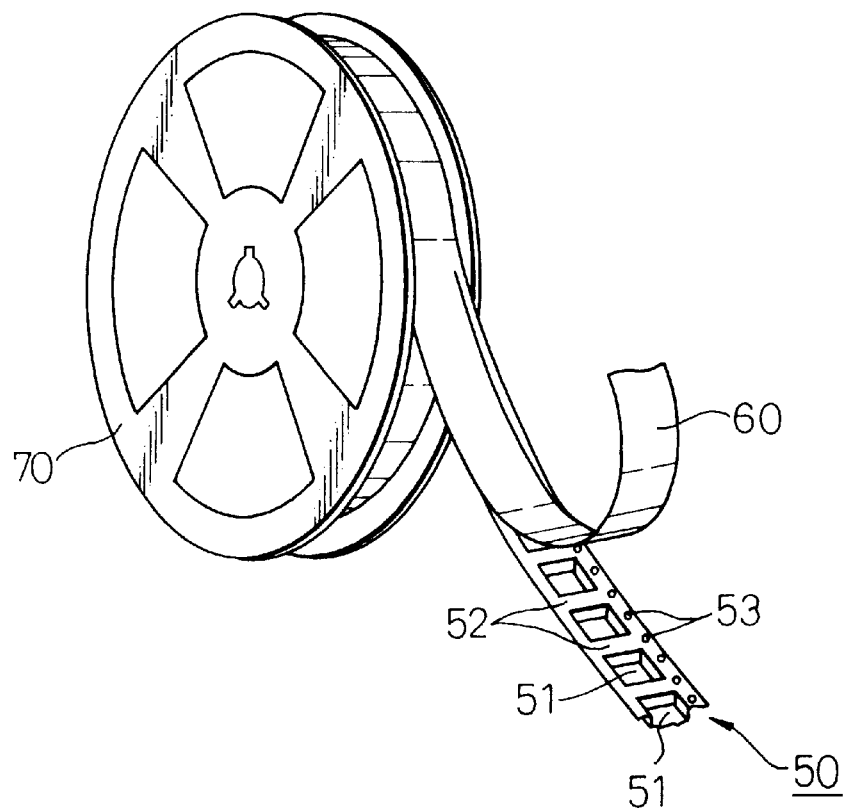
FIG. 15 is a perspective view of an embossed type carrier tape of a prior art.

The carrier tape 10 is a plastic tape having successively arranged pockets 11 at a constant pitch via the connecting walls 12. The thickness of the bottom walls 11a of the pockets 11 is different from that of the connecting walls 12 of the carrier tape 10. That is, the thickness $t_2$ of the connecting walls 12 may be as small as a typical thickness of the conventional embossed type carrier tape to ensure that the carrier tape 10 can be easily wound on a reel (see FIG. 15), and the thickness $t_1$ of at least the bottom walls 11a of the pockets 11 is greater than the thickness $t_2$ of the connecting walls 12 to reinforce at least the bottom walls 11a of the pockets 11.

The carrier tape 10 can be made from any available plastic materials, but the carrier tape 10 is preferably made from a biodegradable plastic for environmental protection. A biodegradable plastic is degraded into water and carbon dioxide by microorganisms if the biodegradable plastic is in contact with soil. Many biodegradable plastics have been developed (aliphatic polyester resin, for example). Also, in the case where the carrier tape 10 is used to accommodate electronic devices such as LSIs which are easily affected by electrification, the carrier tape 10 preferably comprises an electrically conductive plastic in which conductive filler such as carbon black is added. It is preferable that the carrier tape 10 comprises an electrically conductive biodegradable plastic.

An article such as an LSI 100 can be accommodated in each of the pockets 11 of the carrier tape 10 to form a package. A top cover tape can be bonded to the carrier tape 10 and the carrier tape 10 can be wound on a reel, similar to the case of FIG. 15.

The method for fabricating the carrier tape according to the embodiment of the present invention is now described with reference to FIGS. 1A to 3E. The carrier tape 10 is fabricated by injection molding, since the thickness of the bottom walls 11a of the pockets 10 is greater than the thickness of the connecting walls 12, as described with reference to FIGS. 1A and 1B. However, since the carrier tape 10 is relatively long, a plurality of carrier tape sections are first molded so that each of the carrier tape sections has at least one pocket 11, and the carrier tape sections are successively fused and joined at the respective adjacent connecting walls 12 in the form of a longer tape.

For the joining operation, it is possible that the carrier tape sections are fused and joined together by a separately located joining device after many carrier tape sections are molded with the use of molding dies designed to obtain one carrier tape section or a plurality of carrier tape sections per one molding die and removed from the molding dies. Alternatively, it is possible that the carrier tape sections are successively fused and joined in the molding die in which the carrier tape section is molded. The latter method is described in detail.

FIGS. 2A to 2C are views illustrating the method for fabricating the carrier tape 10 according to the embodiment of the present invention. A molding die is used, which has a cavity in which a single carrier tape section 1 can be injection molded and an open portion contiguous to one side of the cavity. The carrier tape section 1 has one pocket 11 and a peripheral flat wall around the pocket 11, the peripheral flat wall including part of the connecting walls 12. Firstly, one carrier tape section 1 is injection molded in the cavity while the cavity is completely closed by inserting an appropriate dummy metal in the open portion. Here, this carrier tape section 1 is referred as a first carrier tape section 1A, as shown in FIG. 2A.

The first carrier tape section 1A is then moved in the direction of the arrow by the distance corresponding to the length of the first carrier tape section 1A, so that the first carrier tape section 1A is located in the open portion contiguous to the cavity and the cavity can thus be completely closed by the first carrier tape section 1A, instead of the dummy metal. In this condition, the new carrier tape section 1 is injection molded in the cavity. The new carrier tape section 1 is referred as a second carrier tape section 1B, as shown in FIG. 2B. In this instance, one side of the first carrier tape section 1A is joined to one side of the second carrier tape section 1B, since the melted plastic in the cavity causes the end portion of the first carrier tape section 1A to be temporarily melted.

The third carrier tape section 1C is then molded and joined to the second carrier tape section 1B, in a manner similar to the previous case, as shown in FIG. 2C. The carrier tape sections are then successively and repeatedly molded and joined, to fabricate a longer continuous tape which can be wound on a reel, starting from the first carrier tape section 1A. A long carrier tape can thus be effectively fabricated.

FIGS. 3A to 3E are views illustrating several examples for joining the carrier tape sections. FIG. 3A shows that the sides of the carrier tape sections to be joined are straight. FIGS. 3B to 3E show that the sides of the carrier tape sections to be joined are bent or curved, and in these cases, the joining surfaces are increased and the joining strength is enhanced.

The present invention is not limited to the above described embodiments, but it is possible to modify the illustrated embodiments. Several modified examples are described below with reference to FIGS. 4 to 12.

Figure 4:
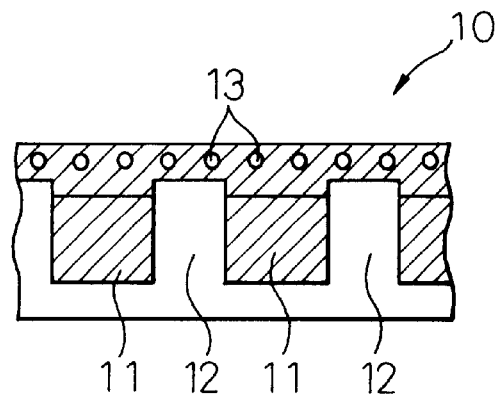
FIG. 4 is a plan view of a carrier tape partially including an electrically conductive plastic.

FIG. 4 shows a plan view of the carrier tape 10 partially using an electrically conductive plastic. A region (hatched region) including the pockets 11 and a portion around the feed holes 13 is made from an electrically conductive plastic (including conductive filler such as carbon black), and the remaining region is made from a normal, electrically non-conductive plastic (not including conductive filler). The electrically conductive plastic is expensive since the conductive filler is added, but the increase in cost of the tape is limited by using the electrically conductive plastic only partially at a region at which anti-electrification effect is effectively obtained. This carrier tape 10 can be fabricated by a known two-color injection molding.

Figure 5A:
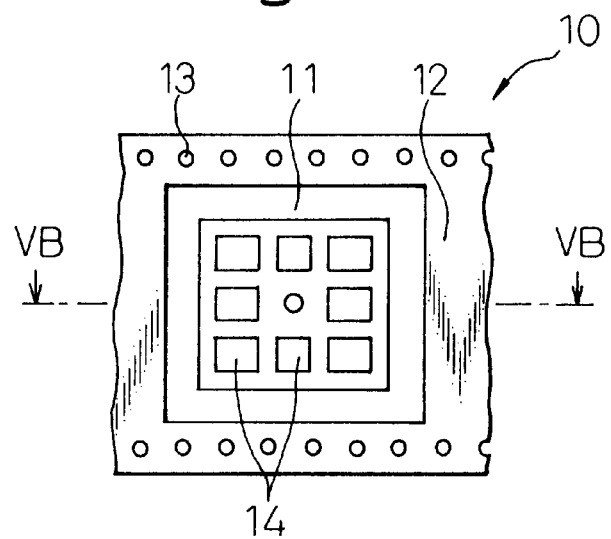
FIG. 5A is a plan view of a carrier tape having through holes at the pocket thereof.
Figure 5B:
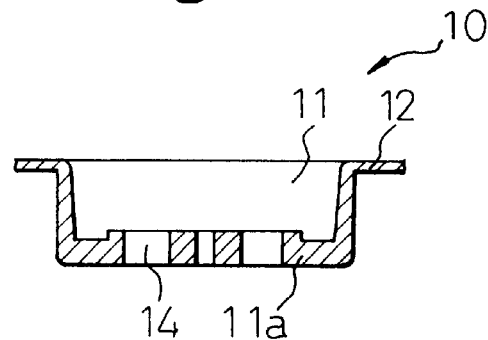
FIG. 5B is a cross-sectional view of the carrier tape of FIG. 5A, taken along the line VB—VB in FIG. 5A.

FIGS. 5A and 5B show the carrier tape 10 having through holes at the pocket thereof. FIG. 5A is a plan view of the carrier tape 10 and FIG. 5B is a cross-sectional view of the carrier tape 10, taken along the line VA—VA in FIG. 5A. A plurality of through holes 14 is provided in the bottom wall 11a of the pocket 11. The peripheral portion of the bottom wall 11a and rib-shaped portion around the through holes 14 have a thickness greater than that of the connecting portion 12 to reinforce the pocket 11, as described above. The through holes 14 function to reduce the cost for material and the weight, and to increase the contact surface to promote degradation of the material when biodegradable plastic is used. The through holes 14 can be formed in the injection molding process.

Figure 6:
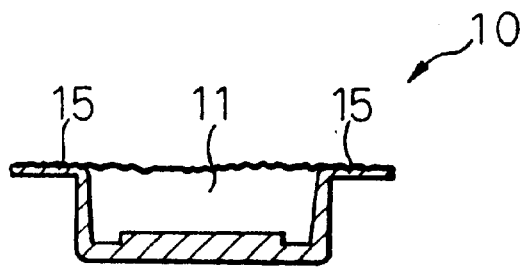
FIG. 6 is a cross-sectional view of a carrier tape having roughened portions.

FIG. 6 is a cross-sectional view of the carrier tape 10 having roughened portions. The carrier tape 10 has a region 15 to which the top cover tape (60 in FIG. 15, for example) is to be bonded after an article is accommodated in the pocket 11, the surface of the region 15 being roughened. The top cover tape is bonded to the region 15 to cover the pocket 11 after an electronic device is accommodated in the pocket 11, and when the electronic device is used (mounted), a relatively great force is needed to peel off the top cover tape if the surface of the carrier tape 10 is smooth. It is possible to adjust the peel-off strength by appropriately roughening the surface of the region 15 to which the top cover tape is to be bonded. It is possible to provide the roughened region 15 to which the top cover tape is to be bonded, by roughening the surface of the corresponding portion of the injection molding die.

Figure 7A:
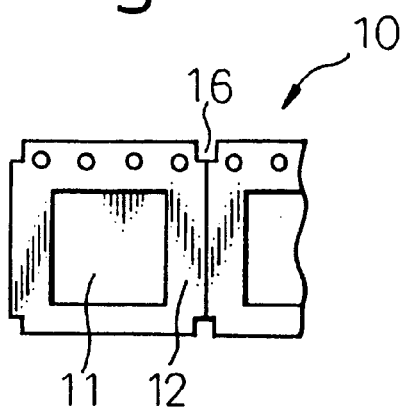
FIG. 7A is a plan view of a carrier tape having a widthwise narrowed portion.
Figure 7B:
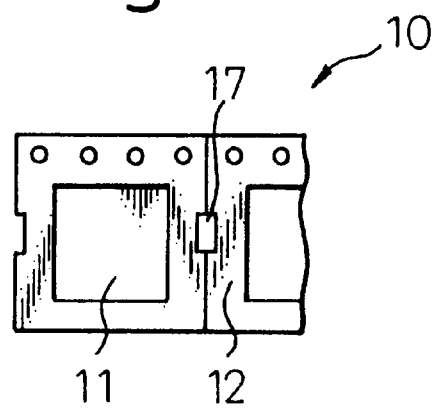
FIG. 7B is a plan view of another example of a carrier tape having a widthwise narrowed portion.

FIGS. 7A and 7B show examples of the carrier tape 10 having a widthwise narrowed portion. In FIG. 7A, notches 16 are provided in the connecting walls 12 to form a widthwise narrowed portion. In FIG. 7B, a through hole 17 is provided in the center of the connecting walls 12 to form a widthwise narrowed portion. In addition, it is possible to provide a straight thin walled portion (not shown) in the connecting wall 12 to form a widthwise narrowed portion. The widthwise narrowed portions can be arranged in the carrier tape 10 at a longitudinally constant pitch.

The carrier tape 10 is severed into small pieces by a cutter which is attached to the automated mounting machine, and the severed carrier tape 50 is disposed of. If the width of the carrier tape 10 is greater and if the thickness of the carrier tape 10 is greater, the load of the cutter becomes heavier. According to this embodiment, the cross-sectional area of the carrier tape 10 is reduced, so the load of the cutter is reduced. The notches 16, the through holes 17, and the thin walled portions can be formed when the carrier tape 10 is injection molded.

Figure 8:
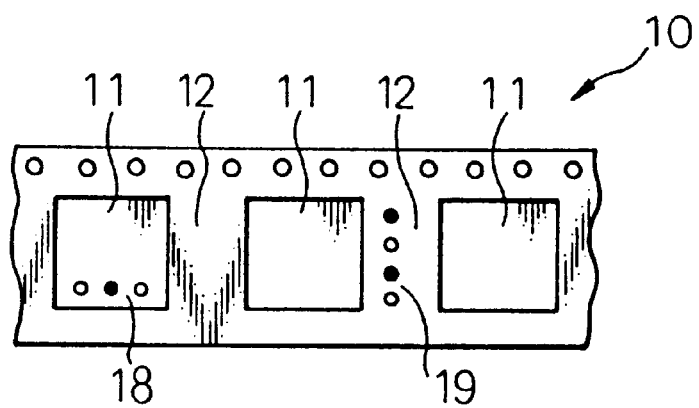
FIG. 8 is a plan view of a carrier tape having a hole pattern.

FIG. 8 is a plan view of the carrier tape 10 having a hole pattern. The carrier tape 10 has a hole pattern 18 at the bottom wall of the pocket 11 and a hole pattern 19 adjacent to the bottom wall of the pocket 11 (at the connecting wall 12). The hole pattern (or punched hole pattern) is a disposition of holes to represent data, and the white circles represent that holes exist and the black circles represent that no hole exists. By the hole pattern 18 or 19, it is possible to indicate the types, the number and so on. The hole pattern can be provided at or adjacent to all the pockets 11, or at or adjacent to a particular pocket 11, depending on the purpose of the indication. The hole patterns 18 and 19 can be formed when the carrier tape 10 is injection molded.

Figure 9:
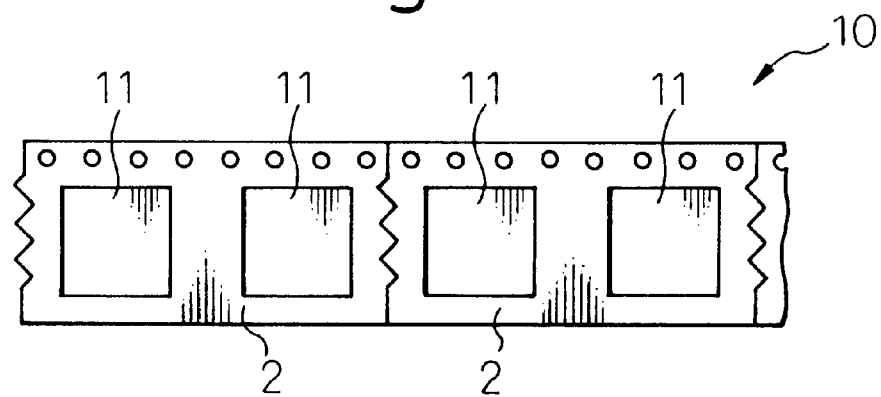
FIG. 9 is a plan view illustrating another example of a method for fabricating a carrier tape.

FIG. 9 is a plan view illustrating another example of a method for fabricating the carrier tape 10. In this figure, the numeral 2 represents a carrier tape section. In the example of FIGS. 2A to 2C, the carrier tape section 1 has one pocket 11 and the carrier tape sections 1 are successively molded and joined. In the example of FIG. 9, the carrier tape section 2 has two pockets 11 and the carrier tape sections 2 are successively molded and joined. It is also possible to arrange such that the carrier tape section has three or more than three pockets 11 and such carrier tape sections are successively molded and joined.

Figure 10:
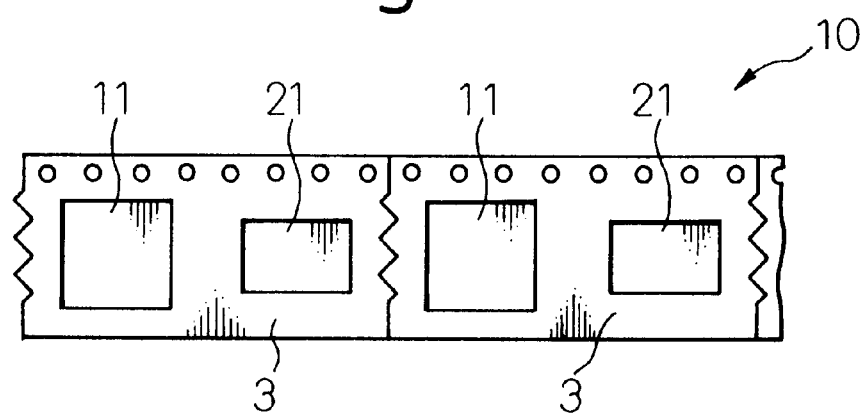
FIG. 10 is a plan view illustrating a further example of a method for fabricating a carrier tape.

FIG. 10 is a plan view illustrating a further example of a method for fabricating the carrier tape 10. In this figure, the numeral 3 represents a carrier tape section, and the numerals 11 and 21 represent pockets. The pockets 11 differ from the pockets 21 in at least one of a shape and a dimension. In the this example, each carrier tape section 3 has a plurality of kinds of pockets 11 and 21 differing in at least one of a shape and a dimension are injection molded, and the carrier tape sections 3 are joined together.

Different kinds of electronic devices can be packed in the thus formed carrier tape 10. That is, in a package comprising the carrier tape 10 and the articles (electronic devices), a plurality of kinds of articles differing in at least one of a shape and a dimension can be accommodated in the different kinds of pockets, respectively. The carrier tape 10 to which the top cover tape is bonded is wound onto the reel, and the thus formed package can be effectively used in the surface-mounting operation for the electronic devices.

Figure 11:
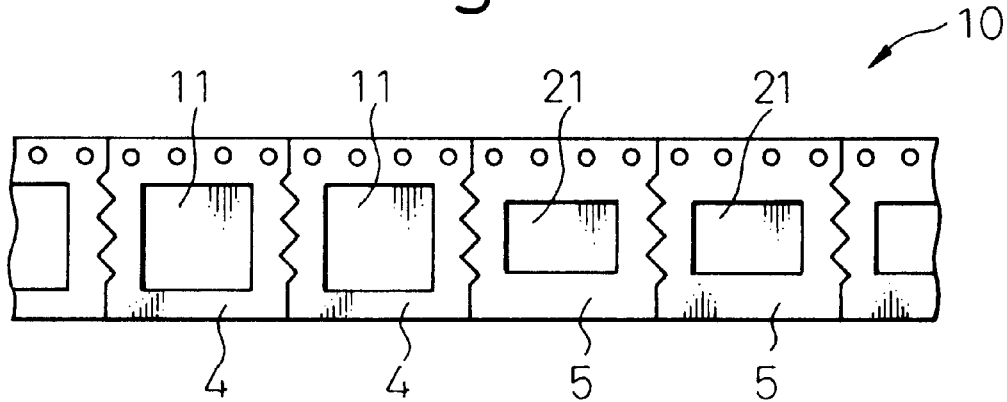
FIG. 11 is a plan view illustrating a further example of a method for fabricating a carrier tape.

FIG. 11 is a plan view illustrating a further example of a method for fabricating the carrier tape 10. In this figure, the numerals 4 and 5 represent carrier tape sections, and the numerals 11 and 21 represent pockets. The pockets 11 differ from the pockets 21 in at least one of a shape and a dimension. In this example, several (a desired number of) carrier tape sections 4 having the pockets 11 are injection molded and joined together, and subsequently, several (a desired number of) carrier tape sections 5 having the pockets 21 are injection molded and joined together.

Different kinds of electronic devices can be packed in the thus formed carrier tape 10. That is, in a package comprising the carrier tape 10 and the articles (electronic devices), a plurality of kinds of articles differing in at least one of a shape and a dimension can be accommodated in the different kinds of pockets, respectively. The carrier tape 10 to which the top cover tape is bonded is wound onto the reel, and the thus formed package can be effectively used in the surface-mounting operation for the electronic devices.

Figure 12:
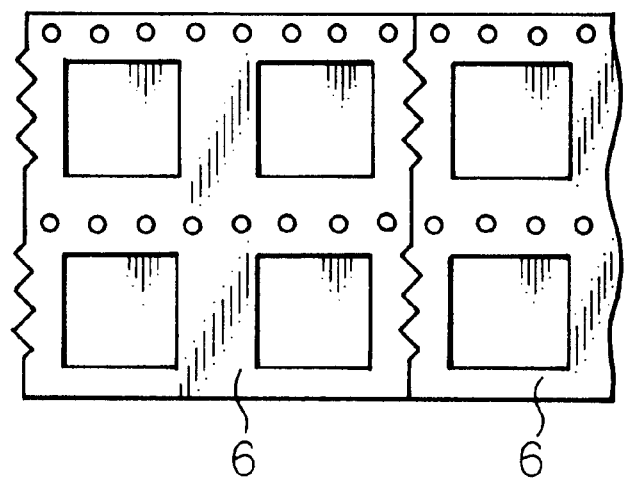
FIG. 12 is a plan view illustrating a still further example of a method for fabricating a carrier tape.
Figure 13:
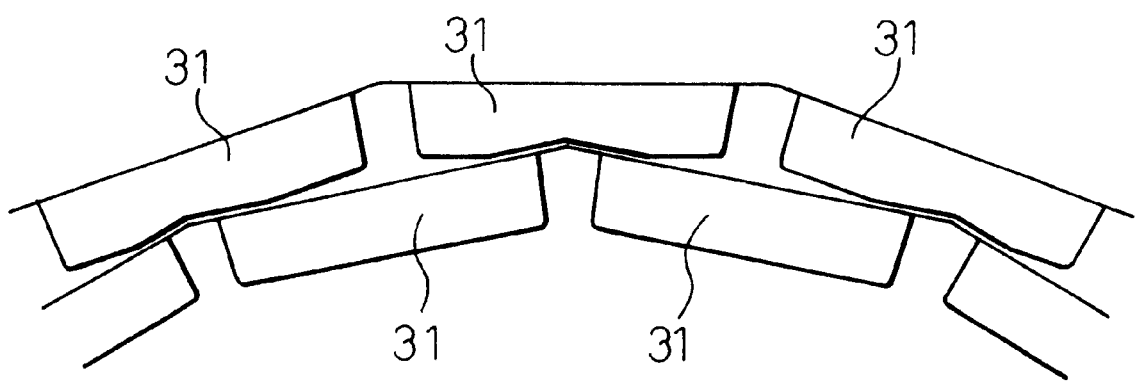
FIG. 13 is a side view of a taped package of a prior art.
Figure 14:
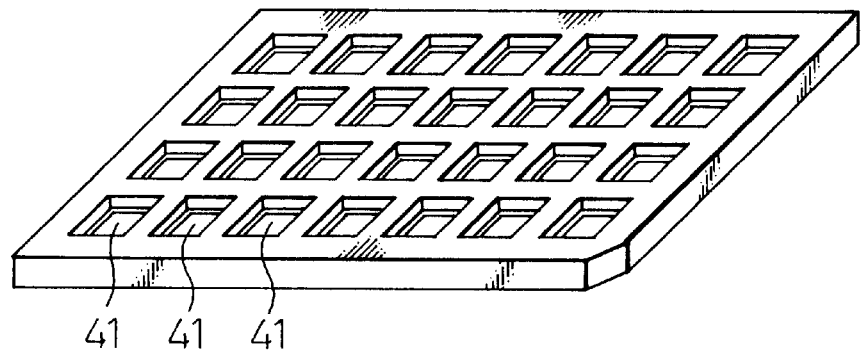
FIG. 14 is a perspective view of a tray of a prior art.

FIG. 12 is a plan view illustrating a further example of a method for fabricating the carrier tape. In this figure, the numeral 6 represents a carrier tape section. The carrier tape section 6 has a width and components for fabricating several (a row in the illustrated example) carrier tapes. A plurality of carrier tape sections 6 is injection molded with the use of a correspondingly shaped molding die and joined together to form a tape. This tape is then divided into a plurality of carrier tapes by cutters.

Therefore, it is possible to fabricate a plurality of the carrier tapes simultaneously, by injection molding a plurality of carrier tape sections 6 and joining the latter together, with the use of a molding die having a cavity corresponding to a plurality of cavities by which a single carrier tape can be fabricated.

As described in greater detail, according to the present invention, an accurate carrier tape and a method for fabricating such a carrier tape are provided, in which it is possible to easily wind the carrier tape and to reinforce the pockets of the carrier tape and to thereby prevent articles accommodated in the pockets from being damaged. As a result, relatively large articles can be packed in the carrier tape, instead of a conventionally used tray, and fed to an automated mounting machine to enhance the efficiency of the mounting operation.

It is claimed:

1. A carrier tape, comprising:
   a row of pockets, each of said pockets including a bottom wall having a planar portion for receiving an article thereon, and side walls;
   connecting walls interconnecting the side walls of adjacent pockets and extending uniformly and continuously between adjacent pockets, wherein the bottom wall planar portion has a thickness greater than a thickness of said connecting walls to reinforce at least said bottom wall,
   wherein the side walls of the pockets are made from a material substantially identical to that of the bottom walls of the pockets, and
   wherein said bottom walls, side walls and connecting walls are integrally injection molded; and
   a top cover tape connected to the connecting walls after an article is received on the planar portion.

2. A carrier tape according to claim 1, wherein said tape comprises an electrically conductive plastic.

3. A carrier tape according to claim 1, wherein said tape comprises a first region including at least said pocket and a second region, said first region comprising an electrically conductive plastic, said second region comprising an electrically non-conductive plastic.

4. A carrier tape according to claim 1, wherein each of said pockets has a plurality of through holes at said bottom wall.

5. A carrier tape according to claim 1, wherein a surface of said connecting walls to which said top cover tape is connected is roughened.

6. A carrier tape according to claim 1, wherein said pockets comprise plurality of kinds of pockets differing in at least one of a shape and a dimension.

7. A carrier tape according to claim 1, wherein said tape has a hole pattern at or adjacent to a particular one of said pockets.

8. A carrier tape according to claim 1, wherein said tape has at least one of through holes, notches, and thin wall portions arranged at a longitudinally constant pitch so that a widthwise cross-sectional area of the tape is reduced.

9. A carrier tape according to claim 1, wherein said tape is made of biodegradable plastic.

10. A taped package, comprising:
    a carrier tape having a row of pockets, each pocket including a bottom wall having a planar portion for receiving an article thereon and side walls;
    connecting walls interconnecting the side walls of adjacent pockets and extending uniformly and continuously between adjacent pockets, wherein the bottom wall planar portion has thickness greater than a thickness of said connecting walls to reinforce at least said bottom wall;
    articles accommodated in said pockets on said planar portions,
    wherein the side walls of the pockets are made from a material substantially identical to that of the bottom walls of the pockets, and
    wherein said bottom walls, side walls, and connecting walls are integrally injection molded; and
    a top cover tape connected to the connecting walls after an article is received on the planar portion.

11. A taped package according to claim 10, wherein said pockets comprise a plurality of kinds of pockets differing in at least one of a shape and a dimension, and said articles comprise a plurality of kinds of articles differing in at least one of a shape and a dimension and accommodated in said different kinds of pockets, respectively.

* * * * *

UNITED STATES PATENT AND TRADEMARK OFFICE
CERTIFICATE OF CORRECTION

PATENT NO.:   5,992,639
DATED    :    November 30, 1999
INVENTOR(S):  Fuminori NAITO; Yukio ANDO; Osamu KANAI; Kazuo KOBAYASHI It is certified that an error appears in the above-identified patent and that said Letters Patent is hereby corrected as shown below:

On the title page, in "[73] Assignees", change "Fujitsu Limited, Kanagawa" to --Fujitsu Limited, Kawasaki--.

Signed and Sealed this

Eighteenth Day of July, 2000

Attest:

Q. TODD DICKINSON

Attesting Officer

Director of Patents and Trademarks